United States Patent
Theuss et al.

(10) Patent No.: US 10,870,575 B2
(45) Date of Patent: Dec. 22, 2020

(54) STRESSED DECOUPLED MICRO-ELECTRO-MECHANICAL SYSTEM SENSOR

(71) Applicant: Infineon Technologies Dresden GmbH & Co. KG, Dresden (DE)

(72) Inventors: Horst Theuss, Wenzenbach (DE); Bernhard Knott, Neumarkt (DE); Thoralf Kautzsch, Dresden (DE); Mirko Vogt, Dresden (DE); Maik Stegemann, Pesterwitz (DE); Andre Roeth, Dresden (DE); Marco Haubold, Dresden (DE); Heiko Froehlich, Radebeul (DE); Wolfram Langheinrich, Dresden (DE); Steffen Bieselt, Stadt Wehlen (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 160 days.

(21) Appl. No.: 16/024,339

(22) Filed: Jun. 29, 2018

(65) Prior Publication Data
US 2020/0002159 A1    Jan. 2, 2020

(51) Int. Cl.
| | | |
|---|---|---|
| *H01L 27/14* | (2006.01) |
| *H01L 29/84* | (2006.01) |
| *H01L 21/00* | (2006.01) |
| *B81B 7/00* | (2006.01) |
| *B81B 3/00* | (2006.01) |
| *B81C 1/00* | (2006.01) |
| *H01L 23/00* | (2006.01) |
| *H01L 23/528* | (2006.01) |
| *H01L 21/56* | (2006.01) |

(52) U.S. Cl.
CPC .......... *B81B 7/0045* (2013.01); *B81B 3/0072* (2013.01); *B81B 7/0032* (2013.01); *B81C 1/00325* (2013.01); *H01L 21/56* (2013.01); *H01L 23/528* (2013.01); *H01L 23/562* (2013.01); *B81B 2201/02* (2013.01)

(58) Field of Classification Search
CPC ....... B81B 7/0045; B81B 3/0072; B81B 7/02; B81B 7/0032; B81C 1/00325; H01L 23/528; H01L 21/56; H01L 21/562; H01L 2924/1461; H01L 23/562
See application file for complete search history.

(56) References Cited

U.S. PATENT DOCUMENTS

2007/0273013 A1* 11/2007 Kohl ................... B81C 1/00333
  257/682
2010/0053922 A1* 3/2010 Ebefors ................ H01L 21/762
  361/772

(Continued)

*Primary Examiner* — Alonzo Chambliss
(74) *Attorney, Agent, or Firm* — Harrity & Harrity, LLP (57) ABSTRACT

A semiconductor device may include a stress decoupling structure to at least partially decouple a first region of the semiconductor device and a second region of the semiconductor device. The stress decoupling structure may include a set of trenches that are substantially perpendicular to a main surface of the semiconductor device. The first region may include a micro-electro-mechanical (MEMS) structure. The semiconductor device may include a sealing element to at least partially seal openings of the stress decoupling structure.

20 Claims, 11 Drawing Sheets

(56) References Cited

U.S. PATENT DOCUMENTS

| | | | |
|---|---|---|---|
| 2011/0057273 A1* | 3/2011 | O'Donnell | B81C 1/0023 |
| | | | 257/414 |
| 2015/0091153 A1* | 4/2015 | Liu | B81C 1/00293 |
| | | | 257/704 |
| 2015/0158716 A1* | 6/2015 | Cheng | B81B 3/0005 |
| | | | 257/254 |
| 2016/0122181 A1* | 5/2016 | Picco | G01L 9/0054 |
| | | | 257/419 |
| 2018/0297838 A1* | 10/2018 | Kautzsch | B81B 7/02 |

* cited by examiner

STRESSED DECOUPLED MICRO-ELECTRO-MECHANICAL SYSTEM SENSOR

BACKGROUND

A micro-electro-mechanical system (MEMS) sensor includes miniaturized mechanical and electro-mechanical elements that operate to perform a sensing functionality. For example, a MEMS sensor may include a mechanical structure (e.g., a membrane), that is coupled to an electrical transducer system (e.g., based on capacitance-detection or piezoresistance) in order to provide a sensing functionality. Examples of such MEMS sensors include pressure sensors, Si-microphones, and others.

SUMMARY

According to some possible implementations, a semiconductor device may include: a stress decoupling structure to at least partially decouple a first region of the semiconductor device and a second region of the semiconductor device, wherein the stress decoupling structure includes a set of trenches that are substantially perpendicular to a main surface of the semiconductor device, and wherein the first region includes a micro-electro-mechanical (MEMS) structure; and a sealing element to at least partially seal openings of the stress decoupling structure.

According to some possible implementations, a micro-electro-mechanical system (MEMS) sensor device may include: a first region comprising a MEMS structure; a second region; a stress decoupling structure that at least partially decouples the first region and the second region, wherein the stress decoupling structure includes a set of trenches; and a sealing element to prevent penetration of the set of trenches.

According to some possible implementations, a method may include: forming a stress decoupling structure that at least partially decouples a first region of a semiconductor device and a second region of the semiconductor device, wherein the stress decoupling structure includes a set of trenches that are substantially perpendicular to a main surface of the semiconductor device; and applying a sealing element that at least partially seals openings associated with the stress decoupling structure.

DETAILED DESCRIPTION

The following detailed description of example implementations refers to the accompanying drawings. The same reference numbers in different drawings may identify the same or similar elements.

As described above, a MEMS sensor may include a mechanical structure, such as a membrane. Such structures are referred to herein as MEMS structures. Due to the mechanical nature of a MEMS structure, a sensor signal may be sensitive not only to a target signal (e.g., a pressure signal, an acoustic signal, and/or the like), but also to mechanical strain on the MEMS sensor itself. Mechanical strain can be induced, for example, during assembly of the MEMS sensor, by thermomechanical stress in the MEMS sensor, by an external mechanical load, and/or the like. Thus, it is desirable to design a semiconductor device that includes the MEMS sensor in a way that makes the MEMS sensor robust (i.e., less sensitive) to these loads. It is further advantageous to design the semiconductor device in a way that makes the MEMS sensor robust against other environmental conditions, such as humidity, temperature changes, chemical substances, particle contamination, and/or the like).

Some prior art MEMS sensors have been designed to reduce undesired mechanical load. Typically, these prior art MEMS sensors aim to reduce mechanical load on the MEMS structure by decoupling a portion of the semiconductor device near the MEMS structure (e.g., a portion of the semiconductor device around which the MEMS structure is arranged) (herein referred to as a sensor region) from another portion of the semiconductor device (e.g., a bulk material of the semiconductor device, one or more metallic layers of the semiconductor device, and/or the like, herein referred to as a non-sensor region). This can be achieved by surrounding the sensor region with trenches (e.g., manufactured using deep trench technology). These trenches can either completely encircle the MEMS structure or can consist of multiple sections (e.g., "L-shaped" sections) that are nested around the MEMS structure. By decoupling the sensor region and the non-sensor region, the trenches act as a stress decoupling structure, making the sensor region and, thus, the MEMS structure, less sensitive to mechanical load that could negatively impact operation. In some cases, the trenches can be fabricated to form spring-like structures in the semiconductor device, leaving the sensor region coupled to the non-sensor region by a set of springs. The use of springs or multiple L-shaped trenches allows conductor lines to be routed from the MEMS structure to another region of the semiconductor device, which may be useful when these regions need to be electrically contacted (e.g., by wirebonds).

However, there are drawbacks to such prior art MEMS sensors. For example, while the trenches, when used as described above, may achieve stress decoupling, the trenches are open to the environment (e.g., since the MEMS structure needs to be open to the environment in order to allow a signal to reach the MEMS structure). As a consequence, the MEMS sensor may not be able to withstand environmental conditions present in some applications, such as those that may be present in an automotive application. As an example, in a given application, humidity may penetrate the trenches, and condensation may occur. The liquid water in the trenches can freeze in a low-temperature condition, which could result in damage to or destruction of the trenches. As another example, chemical substances and/or particles present may penetrate the trenches, which could damage or destroy the trenches and/or reduce the stress decoupling provided by the trenches.

In some cases, some protection from such conditions can be provided using a four-wafer stacked design (i.e., a multi-chip design). According to the four-wafer stacked design, a chip die (e.g., an ASIC die) is arranged at a lowest level, and a carrier die and a MEMS die are stacked on the chip die. Trenches in the MEMS die may decouple a sensor region of the MEMS die, as described above. In this design, a perforated capping die is stacked on top of the MEMS die in order to protect the MEMS die. However, the four-wafer stacked design is complex and expensive in fabrication, and the possibility to reduce a size of such a device is limited. Moreover, perforations in the capping die may limit an amount of protection provided by such a device (e.g., since, due the perforations, the capping die does not seal trench openings on the MEMS die). As such, this design may not be useful in some applications (e.g., where a low cost, high performance, and/or relatively small MEMS sensor is needed).

Some implementations described herein provide an improved stress decoupled MEMS sensor that includes a stress decoupling structure that at least partially decouples a sensor region of a semiconductor device and another region of the semiconductor device, and a sealing element that at least partially seals openings of the stress decoupling structure (e.g., in order to prevent the stress decoupling structure from being penetrated). The improved stress decoupled MEMS sensor may be implemented on a single chip, which reduces cost and complexity of the device (e.g., as compared to the four-wafer design described above).

In some implementations, the improved stress decoupled MEMS sensor may enable high MEMS performance while also providing improved robustness against, for example, humidity, chemical substances, particle contamination, temperature cycles, mechanical shock, and/or the like (e.g., as compared to the prior art MEMS sensors described above). As such, the improved stress decoupled MEMS sensors described herein may be used in an application where relatively harsh conditions may be present, such as an automotive application. Further, in some implementations, the improved stress decoupled MEMS sensors described below may enable cost reduction and/or miniaturization in packaging by allowing relatively low-cost package technologies to be used, as described in further detail below.

Figure 1:
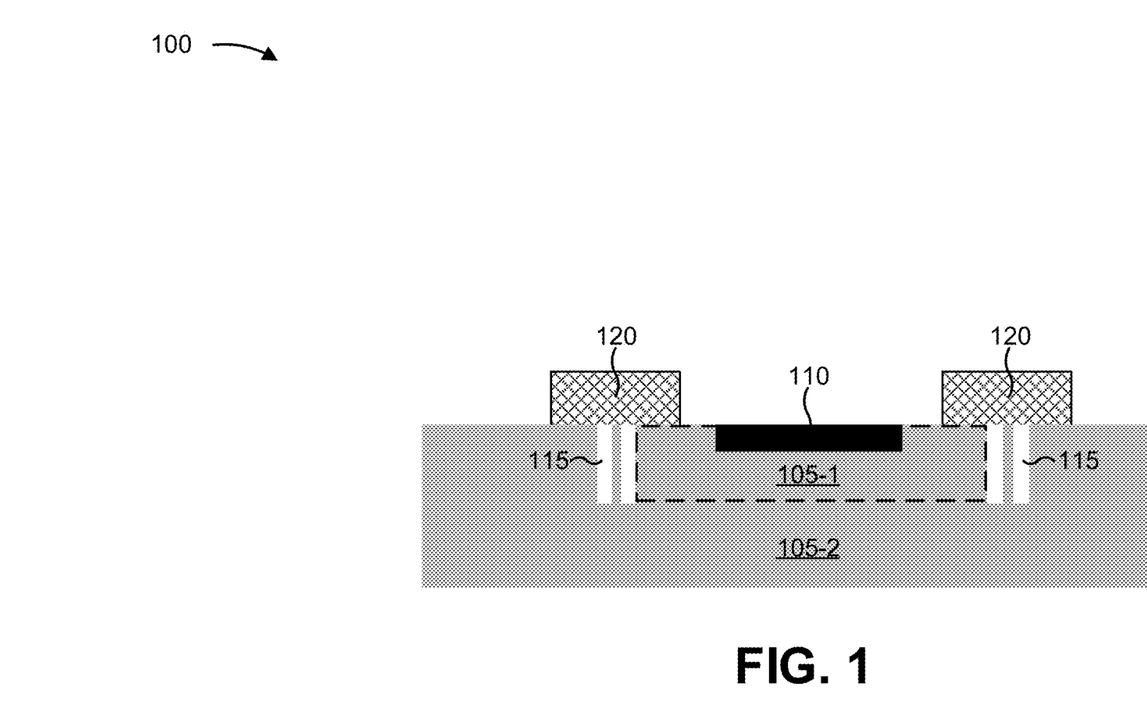
FIG. 1 is a diagram of an overview of an improved stress decoupled MEMS sensor described herein.

FIG. 1 is a diagram of an overview of an improved stress decoupled MEMS sensor described herein. The improved stress decoupled MEMS sensor shown in FIG. 1 (herein referred to as MEMS sensor 100) is meant to provide a general example of an improved stress decoupled MEMS sensor. Particular embodiments of MEMS sensor 100 are shown and described below in association with FIGS. 2A-2C, 3A, 3B, 4A, 4B, 4C, 4D, 4E, 5, 6A, 6B, and 7A-7C.

As shown in FIG. 1, MEMS sensor 100 includes a semiconductor device having a sensor region 105-1 and a non-sensor region 105-2. As shown, a MEMS structure 110 is positioned within sensor region 105-1 of MEMS sensor 100 (e.g., arranged on or embedded in a main surface of MEMS sensor 100, which is illustrated as a top surface of MEMS sensor 100 in FIG. 1).

As further shown in FIG. 1, MEMS sensor 100 includes a stress decoupling structure 115 that at least partially decouples sensor region 105-1 and non-sensor region 105-2. For example, in some implementations, stress decoupling structure 115 may include a set of trenches at least partially surrounding region 105-1 that acts to partially separate sensor region 105-1 from non-sensor region 105-2. In some implementations, a width of a trench included in stress decoupling structure 115 may be in a range from approximately 0.1 µm to approximately 20 µm, such as 2 µm. In some implementations, a depth of a trench included in stress decoupling structure 115 may be in a range from approximately 1 µm to approximately 500 µm, such as 15 µm In some implementations, one or more portions of stress decoupling structure 115 (e.g., one or more trenches) may be substantially perpendicular to the main surface of the semiconductor device, as shown in FIG. 1. In some implementations, stress decoupling structure 115 may include one or more trenches that surround sensor region 105-1 and/or one or more trenches that partially surround sensor region 105-1. As a particular example, stress decoupling structure 115 may include a set of L-shaped trenches.

As another example, while not shown in FIG. 1, in some implementations, stress decoupling structure 115 may include a cavity beneath sensor region 105-1 that acts to partially separate sensor region 105-1 from non-sensor region 105-2. In some implementations, such a cavity may be formed using a silicon-on-nothing (SON) process (sometimes referred to as a Venezia process). Thus, in some implementations, one or more portions of stress decoupling structure 115 may be substantially parallel to the main surface of the semiconductor device (e.g., when a horizontal cavity is formed beneath sensor region 105-1). In some implementations, a height of the cavity beneath sensor region 105-1 may be in a range from approximately 0.1 µm to approximately 10 µm, such as 2 µm. In some implementations, a thickness of sensor region 105-1 above the cavity may be in a range from approximately 1 µm to approximately 50 µm, such as 15 µm. In some implementations, stress decoupling structure 115 may include a set of trenches and a cavity, examples of which are provided below.

As further shown in FIG. 1, MEMS sensor 100 may include a sealing element 120 arranged on or over openings of stress decoupling structure 115. In some implementations, sealing element 120 may act to at least partially seal the openings (e.g., from environmental conditions), thereby preventing penetration of the openings (e.g., by humidity, condensation, chemical substances, particles, and/or the like). In some implementations, sealing element 120 may include a cap (e.g., formed from a dense material, formed from an elastic material, formed from a polysilicon material, and/or the like), a die attach material, a gel, or another type of material. Various implementations of sealing element 120 are provided in the below embodiments.

Due to the stress decoupling afforded by stress decoupling structure 115 and the protection afforded by sealing element 120, MEMS sensor 100 may achieve high MEMS performance, while also providing improved robustness against environmental conditions (e.g., as compared to the prior art MEMS sensors described above). As such, MEMS sensor 100 may be used in an application in which relatively harsh conditions may be expected, such as an automotive application.

As indicated above, FIG. 1 is provided merely as an example. Other examples are possible and may differ from what was described with regard to FIG. 1. For example, the number, arrangement, and size of elements and layers shown in FIG. 1 are provided as examples. In practice, MEMS sensor 100 may include additional elements and/or layers, fewer elements and/or layers, different elements and/or layers, differently arranged elements and/or layers, elements and/or layers with different relative sizes, and/or the like, than those shown in FIG. 1.

As a particular example, while a dashed rectangle defines sensor region 105-1 from non-sensor region 105-2, this is merely an example provided for illustrative purposes. In practice, sensor region 105-1 may not be precisely defined and/or may be defined differently than illustrated. As another example, a number, arrangement, and depth of trenches of stress decoupling structure 115 are provided for illustrative purposes and, in practice, the number, arrangement, and/or depth of trenches of stress decoupling structure 115 may be different than illustrated.

Figure 2A:
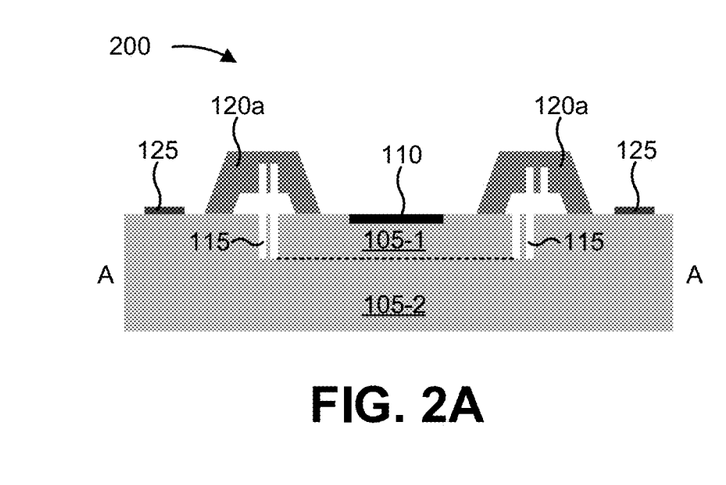
FIGS. 2A-2C are diagrams of an example implementation of an improved stress decoupled MEMS sensor in which a sealing element comprises a cap.
Figure 2B:
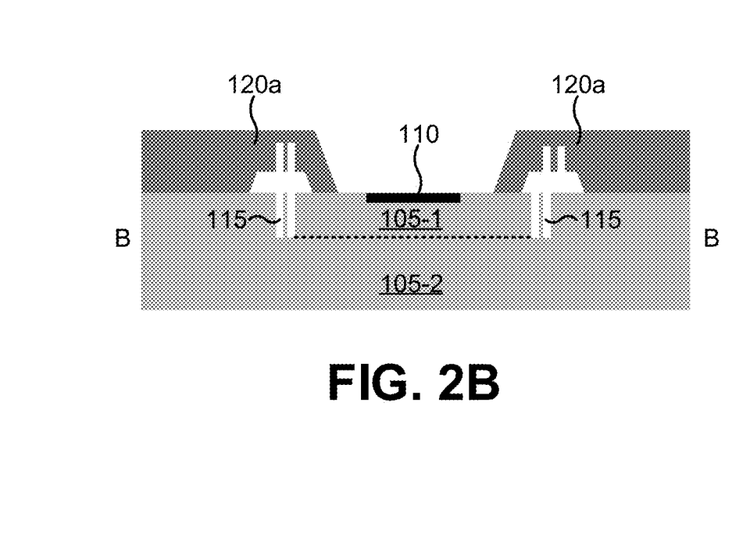
Figure 2C:
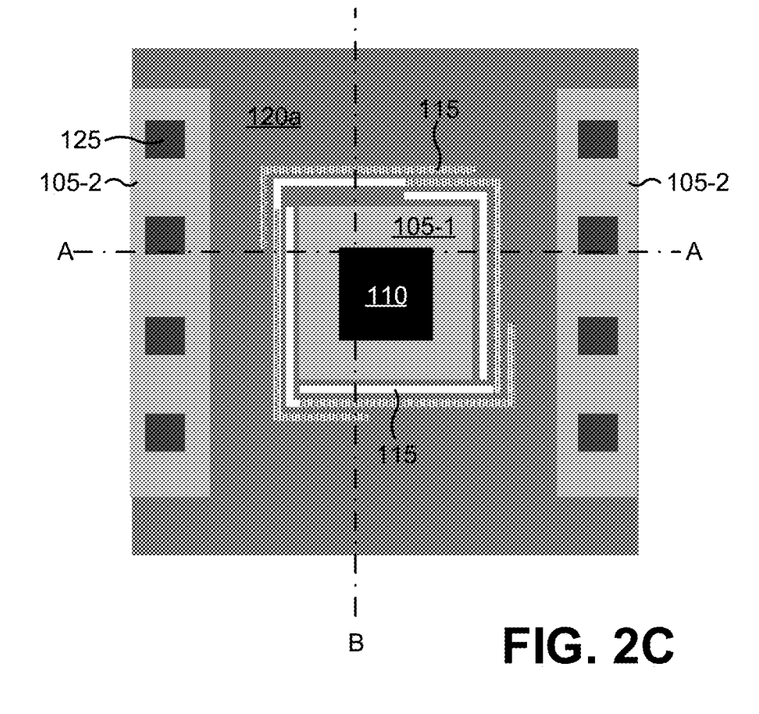

FIGS. 2A-2C are diagrams of an example implementation 200 of a MEMS sensor 100 in which sealing element 120 comprises a cap 120a. The improved stress decoupled MEMS sensor of FIGS. 2A-2C is referred to herein as MEMS sensor 200. FIGS. 2A and 2B are cross sectional views along lines "A-A" and "B-B" shown in the top view illustrated by FIG. 2C. As shown, MEMS sensor 200 includes sensor region 105-1, non-sensor region 105-2, MEMS structure 110, stress decoupling structure 115 (e.g., a set of L-shaped trenches arranged around MEMS structure 110), cap 120a, and a set of electrical contacts 125.

In some implementations, cap 120a may be formed from a dense material, such as silicon, glass, and/or another material through which humidity, water, chemical substances, particles, and/or the like, cannot penetrate. In some implementations, cap 120a may at least partially seal the openings of stress decoupling structure 115. For example, as shown, cap 120a may be formed such that, when attached to sensor region 105-1 and non-sensor region 105-2, a sealed cavity exists between cap 120a and the openings, and such that MEMS structure 110 is open. In some implementations, cap 120a may be attached to the semiconductor device using a wafer bonding process (e.g., Si-to-Si bonding, anodic bonding, a soldering process, direct metal bonding, glass frit bonding, and/or the like) in order to provide such sealing. Additionally, or alternatively, cap 120a may be attached to the semiconductor device using an adhesive material. In some implementations, cap 120a may act to hermetically seal the openings of stress decoupling structure 115. In some implementations, a thickness of the dense cap of MEMS sensor 200 may be in a range from approximately 0.1 mm to approximately 1.5 mm, such as 0.5 mm.

As further shown in FIGS. 2A-2C, in some implementations, cap 120a may be formed such that electrical contacts 125, if included in MEMS sensor 200, are exposed in order to allow electrical contacts 125 to be electrically contacted (e.g., by wirebonds).

As further shown, in some implementations, cap 120a may include a stress decoupling structure associated with decoupling sensor region 105-1 and non-sensor region 105-2. For example, as shown in FIGS. 2A-2C, cap 120a may include a stress decoupling structure (e.g., a set of L-shaped trenches). In some implementations, as shown, stress decoupling structure 115 may be formed such that openings of stress decoupling structure 115 are on a surface of cap 120a (e.g., a bottom surface of cap 120a) that allows the openings of the cap stress decoupling structure to be at least partially sealed when cap 120a is attached to the semiconductor device. Additionally, or alternatively, stress decoupling structure 115 may be formed such that openings of stress decoupling structure 115 are on another surface of cap 120a (e.g., a top surface of cap 120a).

In some implementations, the stress decoupling structure of cap 120a may be structured similarly to stress decoupling structure 115, as indicated in FIGS. 2A-2C. Alternatively, the stress decoupling structure of cap 120a may be structured differently than stress decoupling structure 115. In some implementations, a width of a trench included in the cap stress decoupling structure may be in a range from approximately 0.1 μm to approximately 50 μm, such as 3 μm. In some implementations, a depth of a trench included in the cap stress decoupling structure may be in a range from approximately 0.01 mm to approximately 1.0 mm, such as 0.4 mm.

In some implementations, the cap stress decoupling structure may be provided in order to further decouple sensor region 105-1 and non-sensor region 105-2. For example, the cap stress decoupling structure may be included in MEMS sensor 200 in order to reduce mechanical load resulting from the physical connection between sensor region 105-1 and non-sensor region 105-2 provided by cap 120a.

As indicated above, FIGS. 2A-2C are provided merely as examples. Other examples are possible and may differ from what was described with regard to FIGS. 2A-2C. Further, the number, arrangement, and size of elements and layers shown in FIGS. 2A-2C are provided as examples. In practice, MEMS sensor 200 may include additional elements and/or layers, fewer elements and/or layers, different elements and/or layers, differently arranged elements and/or layers, differently sized elements and/or layers, elements and/or layers with different relative sizes, and/or the like, than those shown in FIGS. 2A-2C.

Figure 3A:
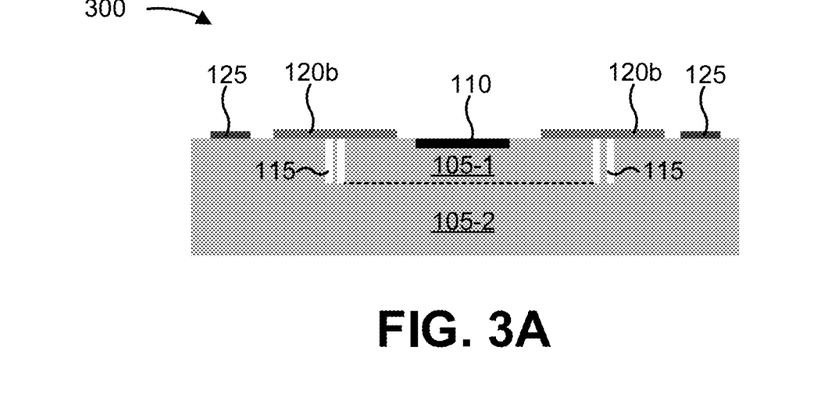
FIGS. 3A and 3B are diagrams of additional example implementations of an improved stress decoupled MEMS sensor in which a sealing element comprises a cap.
Figure 3B:
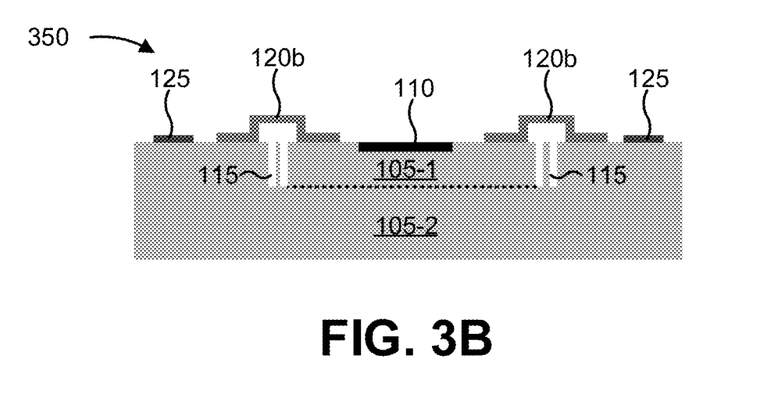

FIGS. 3A and 3B are diagrams of example implementations 300 and 350, respectively, of a MEMS sensor 100 in which sealing element 120 comprises a cap 120b. The improved stress decoupled MEMS sensors of FIGS. 3A and 3B are referred to herein as MEMS sensor 300 and MEMS sensor 350, respectively. As shown, MEMS sensors 300 and 350 include sensor region 105-1, non-sensor region 105-2, MEMS structure 110, stress decoupling structure 115 (e.g., a set of L-shaped trenches arranged around MEMS structure 110), cap 120b, and a set of electrical contacts 125.

In MEMS sensor 300 and MEMS sensor 350, cap 120b is formed from an elastic material (rather than a dense material, as described in association with MEMS sensor 200). For example, cap 120b may be formed from a spin-on dielectric material, a silicone-based material layer, an oil-based material, an organic material, and/or another type of material which has intrinsic spring-like properties. In some implementations, the elastic cap may be applied on a wafer-level using, for example, a spin-on process, a laminating process, and/or the like. Alternatively, the elastic cap may be applied using another type of process, such as a pick-and-place process.

In some implementations, cap 120b may include multiple layers that include a metal structure (e.g., a conductor line). In some implementations, a thickness of the elastic cap of MEMS sensor 300 or MEMS sensor 350 may be in a range from approximately 0.5 μm to approximately 20 μm, such as 5 μm.

In some implementations, cap 120b may at least partially seal the openings of stress decoupling structure 115. For example, as shown in MEMS sensor 300 of FIG. 3A, cap 120b may be formed flush with the main surface of the semiconductor device such that cap 120b covers the openings of stress decoupling structure 115. In some implementations, cap 120b may be formed such that cap 120b at least partially fills one or more portions of stress decoupling structure 115 (e.g., such that a portion of cap 120*b* may be present in a top-most portion of a given trench of stress decoupling structure 115). As another example, as shown in MEMS sensor 350 of FIG. 3B, cap 120*b* may be structured such that a cavity exists between cap 120*b* and the openings. In some implementations, the geometry of cap 120*b* of MEMS sensor 350 may be provided in order to support the elastic spring-like functionality of cap 120*b*.

In some implementations, the elastic properties of cap 120*b* provide stress decoupling for the physical connection between sensor region 105-1 and non-sensor region 105-2 that is provided by cap 120*b*. In other words, cap 120*b* may intrinsically include a cap stress decoupling structure as a result of elastic properties of a material from which cap 120*b* is formed.

Notably, the elastic material of cap 120*b* may be comparatively more permeable than a dense material of cap 120*a* and, thus, may provide comparatively less protection from, for example, humidity. However, the protection provided by cap 120*b* may be sufficient in a given application. Further, cap 120*b* may be comparatively simpler and/or less expensive to form, implement, or place than cap 120*a* in some cases.

As indicated above, FIGS. 3A and 3B are provided merely as examples. Other examples are possible and may differ from what was described with regard to FIGS. 3A and 3B. Further, the number, arrangement, and size of elements and layers shown in FIGS. 3A and 3B are provided as examples. In practice, MEMS sensors 300 and/or 350 may include additional elements and/or layers, fewer elements and/or layers, different elements and/or layers, differently arranged elements and/or layers, differently sized elements and/or layers, elements and/or layers with different relative sizes, and/or the like, than those shown in FIGS. 3A and 3B.

In some implementations, relatively low-cost molded packaging technologies can be used in order to form a molded package for MEMS sensor 100. Such low-cost molded packaging technologies include, for example, film assisted molding, pin molding, and/or the like. Typically, use of a low-cost molded packaging technology to form a molded package would induce mechanical stress on a semiconductor device (e.g., due to a mold pressure, due to thermomechanical properties of a thermoset material, due to penetration of trenches by the thermoset material, and/or the like) which would result in unwanted influence on a MEMS structure of the semiconductor device. However, inclusion of stress decoupling structure 115 and sealing element 120 (in order to seal openings of stress decoupling structure 115 and provide further stress decoupling via stress decoupling structure present in sealing element 120), enables use of these low-cost molded packaging technologies without negatively impacting performance of MEMS sensor 100.

FIGS. 4A, 4B, 4C, 4D, and 4E are diagrams of example implementations 410, 420, 430, 440, and 450, respectively, illustrating packaging solutions for MEMS sensors 100 including sealing element 120 in the form of a cap 120*a* or 120*b*, as described above. The improved stress decoupled MEMS sensors of FIGS. 4A, 4B, 4C, 4D, and 4E are referred to herein as MEMS sensor 410, MEMS sensor 420, MEMS sensor 430, MEMS sensor 440, and MEMS sensor 450, respectively, and collectively as MEMS sensors 400. As shown in FIGS. 4A-4E, MEMS sensors 400 may be arranged on a die 130 (e.g., a chip die), and may include a molded package 135. As shown, molded package 135 includes an opening over MEMS structure 110 (e.g., in order to allow a target signal to reach MEMS structure 110). In other words, molded package 135 may be formed to include an opening over a portion of sensor region 105-1 on which MEMS structure 110 is arranged.

Figure 4A:
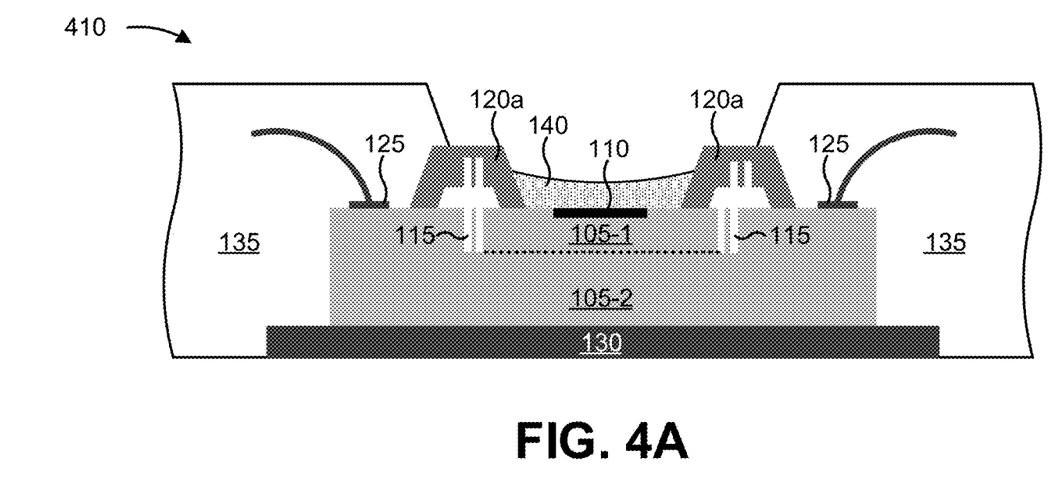
FIGS. 4A-4E are diagrams of example implementations of packaging solutions for an improved stress decoupled MEMS sensor including a sealing element in the form of a cap.
Figure 4B:
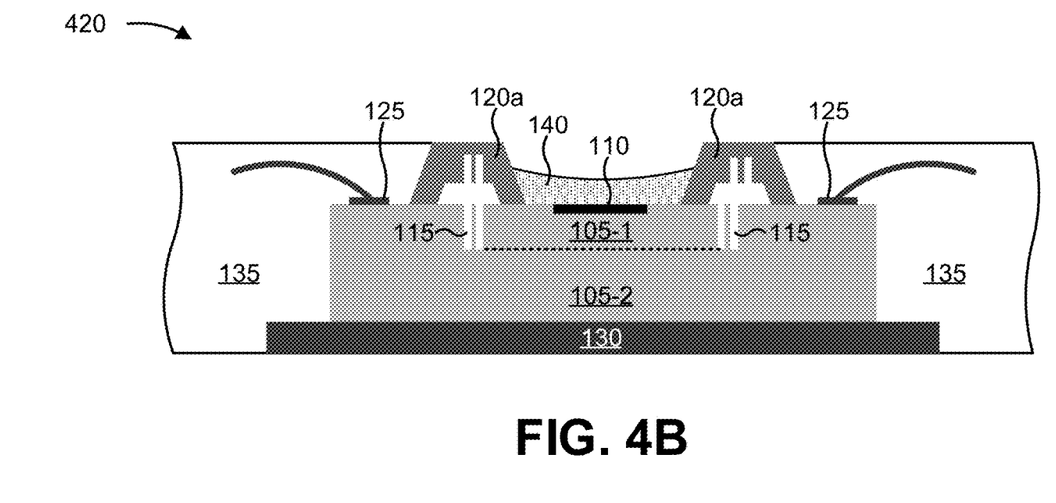

As further shown in FIGS. 4A-4E, MEMS sensors 400 may include a gel 140 that covers MEMS structure 110 (e.g., in order to protect MEMS structure 110 from mechanical shock, particle contamination, chemical substances, and/or the like). In some implementations, gel 140 may comprise a material that allows a target signal to reach MEMS structure 110 through gel 140. For example, gel 140 may comprise a material with a low Youngs Modulus (e.g., <100 megaPascals)—such as a silicone-based gel materials. In some implementations, a thickness of gel 140 over MEMS structure 110 may be in a range from approximately 1 µm to approximately 20 µm such as 5 µm, as well as a range from approximately 20 µm to approximately 300 µm, such as 50 µm As illustrated by FIGS. 4A-4E, various low-cost molded package solutions are possible. MEMS sensor 410 of FIG. 4A includes cap 120*a*, formed from a dense material, that includes a cap stress decoupling structure formed on an unexposed surface (e.g., a bottom surface) of cap 120*a* in order to allow openings of the cap stress decoupling structure 115 to be sealed. As shown, in MEMS sensor 410, molded package 135 is formed such that a thickness of molded package 135 on the main surface of the semiconductor device is greater than a thickness of cap 120*a* on the main surface of the semiconductor device, and such that molded package 135 partially covers cap 120*a*. MEMS sensor 420 of FIG. 4B is similar to MEMS sensor 410, except that molded package 135 of MEMS sensor 420 is formed such that a thickness of molded package 135 on the main surface of the semiconductor device is approximately equal to a thickness of cap 120*a* on the main surface of the semiconductor device.

Figure 4C:
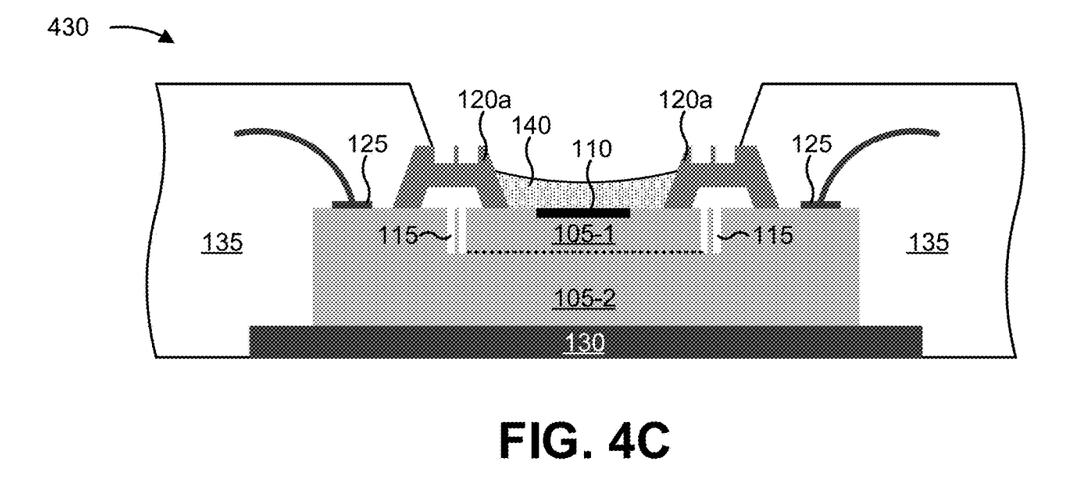
Figure 4D:
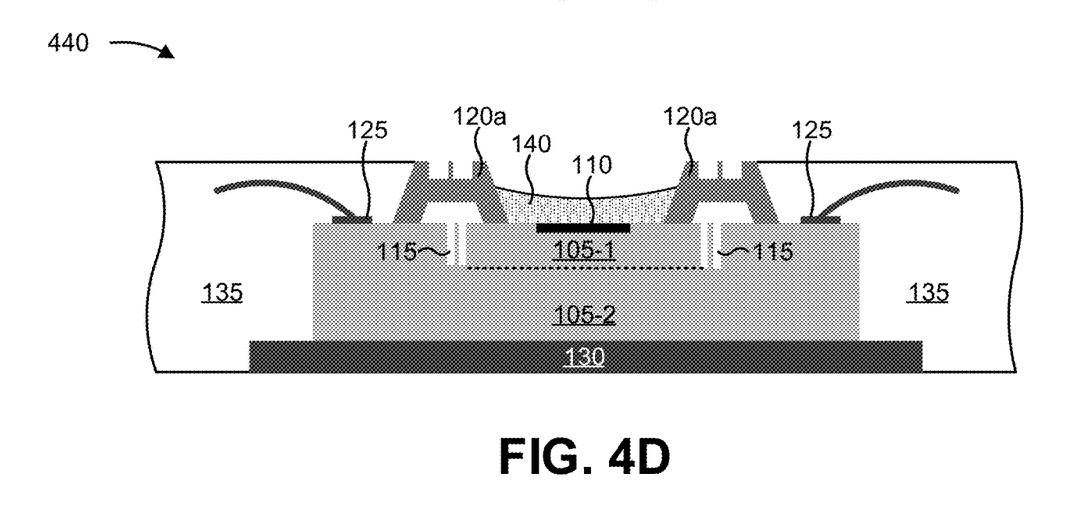

MEMS sensor 430 of FIG. 4C includes cap 120*a*, formed from a dense material, that includes a cap stress decoupling structure formed on an exposed surface (e.g., a top surface) of cap 120*a*. In some implementations, as shown, a cap stress decoupling structure on an exposed surface may be formed to be comparatively wider (e.g., may include comparatively wider trenches) than stress decoupling structure 115. In some implementations, the exposed openings of the cap stress decoupling structure may be partially filled with gel 140 (e.g., in order to prevent penetration). As shown, in MEMS sensor 430, molded package 135 is formed such that a thickness of molded package 135 on the main surface of the semiconductor device is greater than a thickness of cap 120*a* on the main surface of the semiconductor device, and such that molded package 135 partially covers cap 120*a*. MEMS sensor 440 of FIG. 4D is similar to MEMS sensor 430, except molded package 135 is formed such that a thickness of molded package 135 on the main surface of the semiconductor device is approximately equal to a thickness of cap 120*a* on the main surface of the semiconductor device.

Figure 4E:
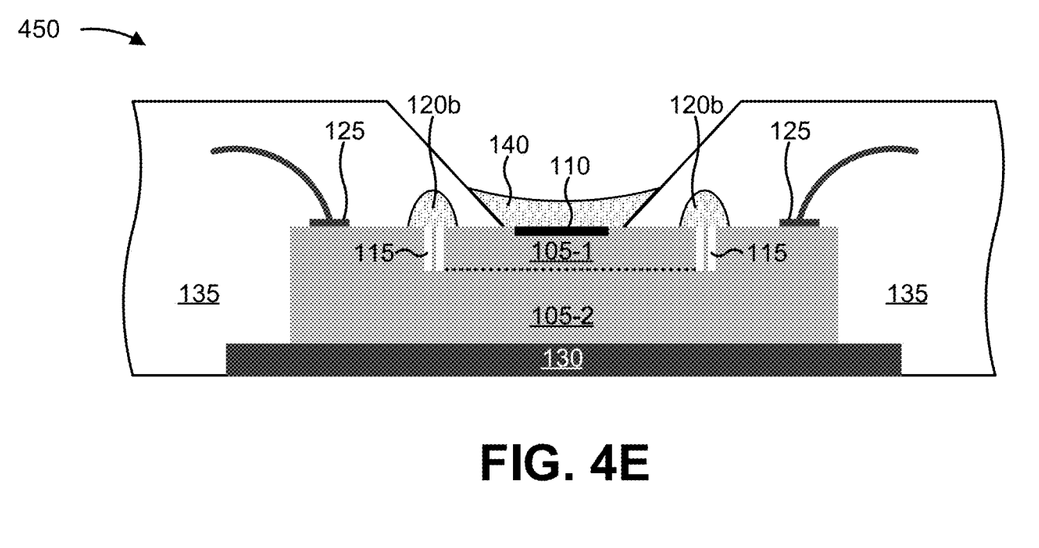

MEMS sensor 450 of FIG. 4E includes cap 120*b*, formed from an elastic material (e.g., a silicone-based material, an oil-based material, an organic material, and/or the like), that provides stress decoupling due to the elastic properties of the elastic material. As shown, in MEMS sensor 450, molded package 135 is formed such that molded package 135 completely covers cap 120*b*, in some implementations.

As indicated above, FIGS. 4A-4E are provided merely as examples. Other examples are possible and may differ from what was described with regard to FIGS. 4A-4E. Further, the number, arrangement, and size of elements and layers shown in FIGS. 4A-4E are provided as examples. In practice, MEMS sensors 410, 420, 430, 440, and/or 450 may include additional elements and/or layers, fewer elements and/or layers, different elements and/or layers, differently arranged elements and/or layers, differently sized elements and/or layers, elements and/or layers with different relative sizes, and/or the like, than those shown in FIGS. 4A-4E.

Figure 5:
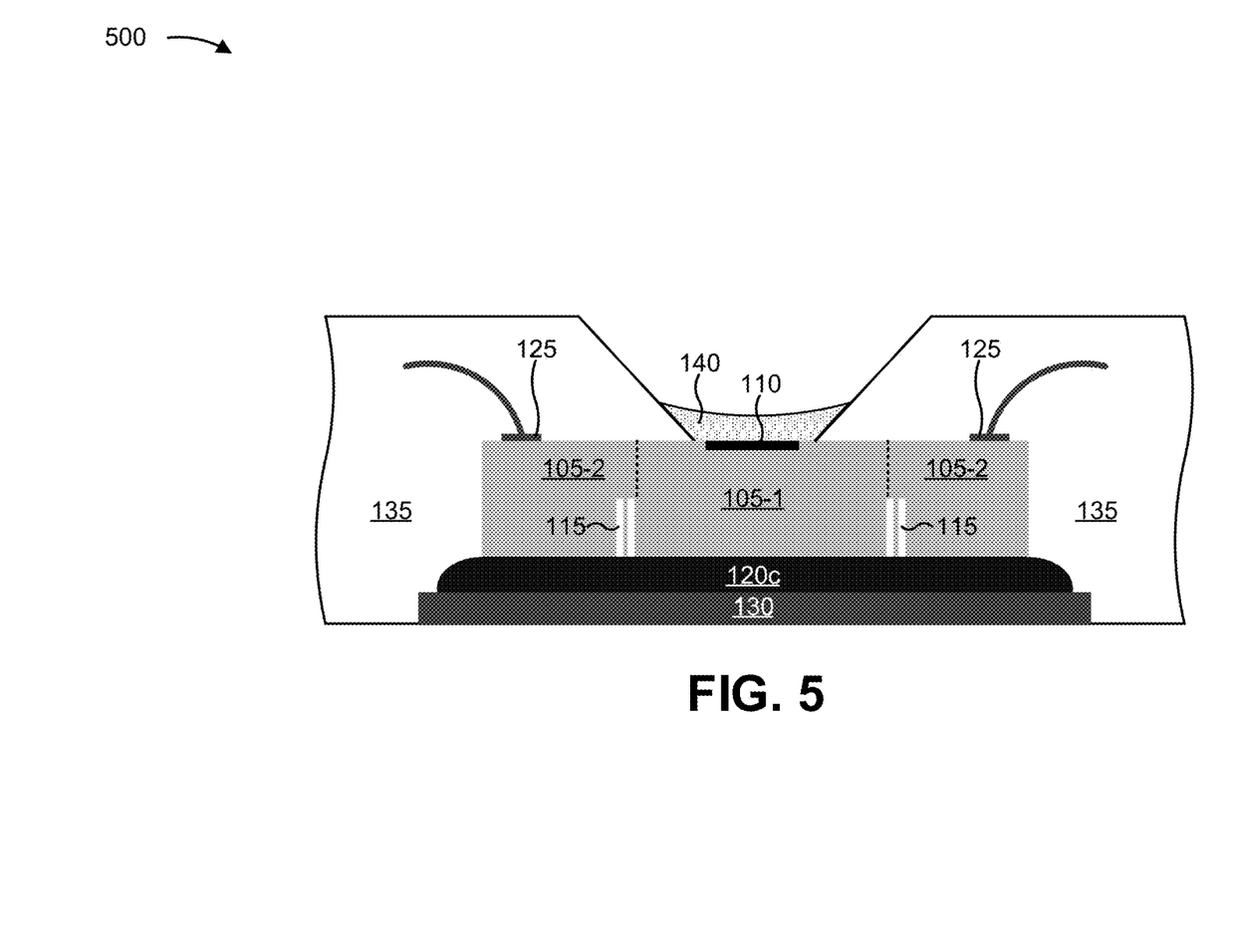
FIG. 5 is a diagram of an example implementation of an improved stress decoupled MEMS sensor in which a sealing element comprises a die attach material.

FIG. 5 is a diagram of an example implementation 500 of a MEMS sensor 100 in which sealing element 120 comprises a die attach material 120c. The improved stress decoupled MEMS sensor of FIG. 5 is referred to herein as MEMS sensor 500. As shown, MEMS sensor 500 includes sensor region 105-1, non-sensor region 105-2, MEMS structure 110, stress decoupling structure 115, die attach material 120c, and a set of electrical contacts 125.

As shown, in MEMS sensor 500, stress decoupling structure 115 is formed on a surface of the semiconductor device opposite to the main surface of the semiconductor device (e.g., stress decoupling structure 115 is formed on the bottom surface of the semiconductor device in MEMS sensor 500). Thus, die attach material 120c, which attaches MEMS sensor 500 to die 130, serves as sealing element 120. In some implementations, die attach material 120c may include a silicon-based glue, or another type of adhesive material. In some implementations, die attach material 120c may exhibit elastic properties that provide stress decoupling for the physical connection between sensor region 105-1 and non-sensor region 105-2 that is provided by die attach material 120c (e.g., similar to elastic properties of cap 120b). In other words, die attach material 120c may intrinsically include a stress decoupling structure as a result of elastic properties of a material from which die attach material 120c.

FIG. 5 further illustrates a molded package solution for MEMS sensor 500. As shown, molded package 135 is formed with an opening over MEMS structure 110, and MEMS structure 110 is covered by gel 140. In some implementations, molded package 135 of MEMS sensor 500 may be formed using a low-cost molded packaging technology, as described above.

As indicated above, FIG. 5 is provided merely as an example. Other examples are possible and may differ from what was described with regard to FIG. 5. Further, the number, arrangement, and size of elements and layers shown in FIG. 5 are provided as examples. In practice, MEMS sensor 500 may include additional elements and/or layers, fewer elements and/or layers, different elements and/or layers, differently arranged elements and/or layers, differently sized elements and/or layers, elements and/or layers of different relative sizes, and/or the like, than those shown in FIG. 5.

Figure 6A:
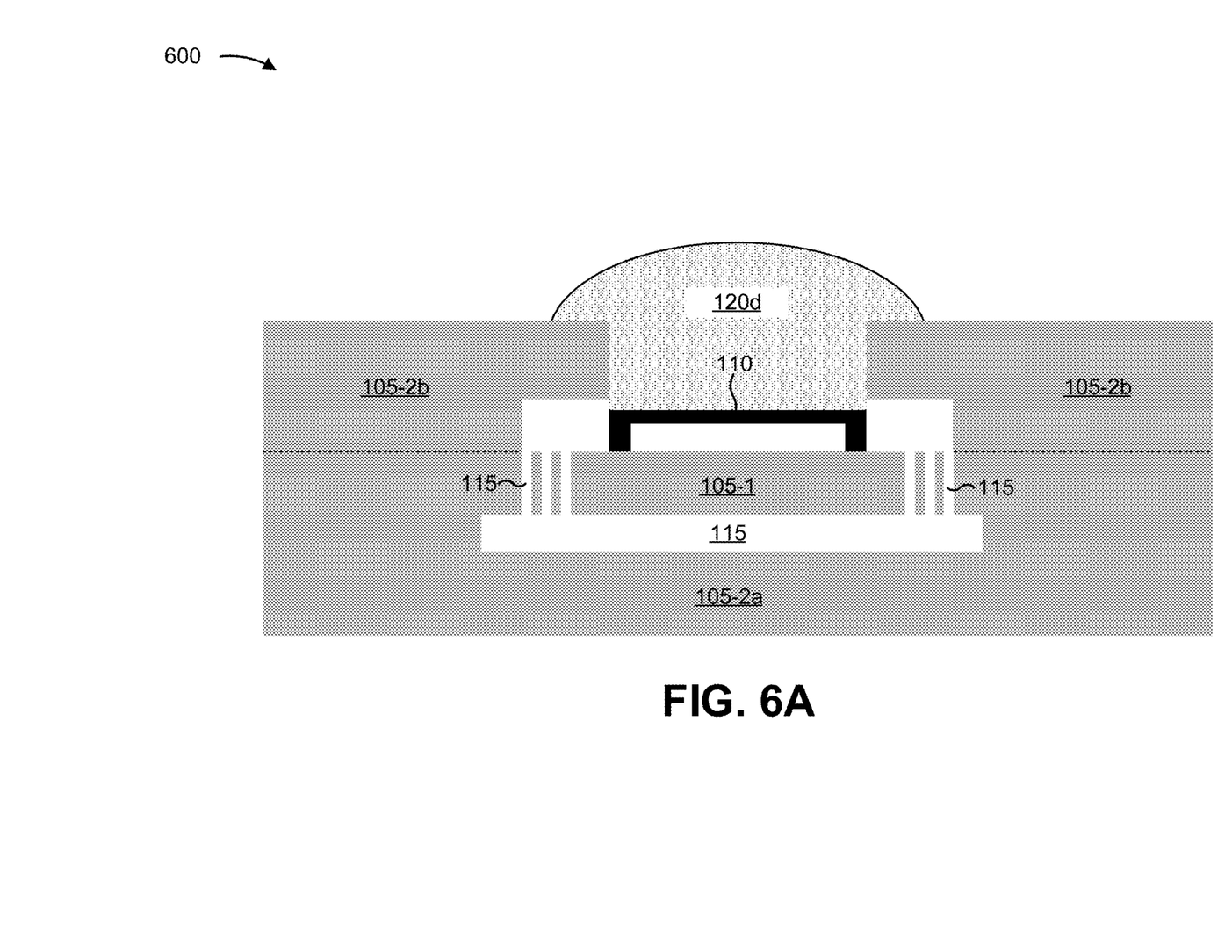
FIGS. 6A and 6B are diagrams of example implementations of improved stress decoupled MEMS sensors in which a sealing element comprises a gel.
Figure 6B:
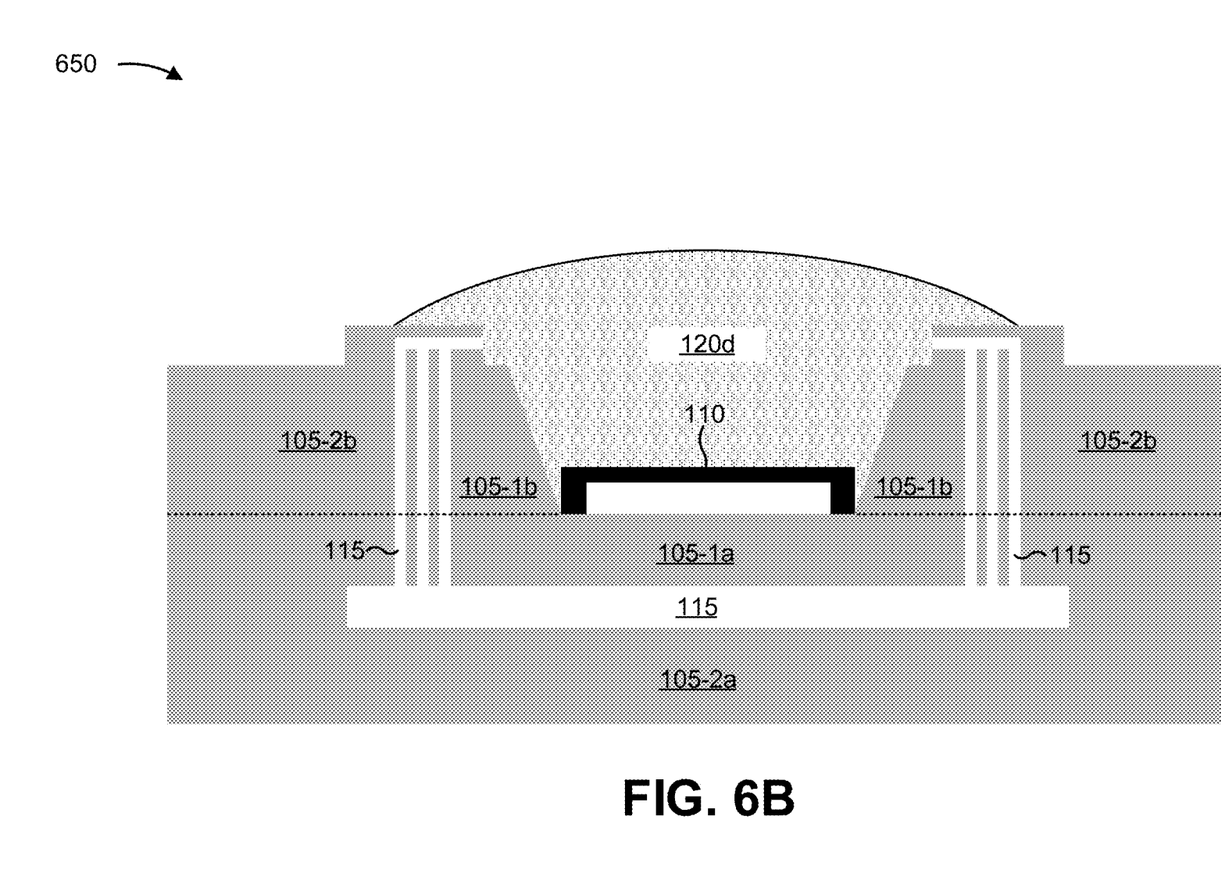

FIGS. 6A and 6B are diagrams of example implementations of MEMS sensor 100 in which sealing element 120 comprises gel 120d. The improved stress decoupled MEMS sensors of FIGS. 6A and 6B are referred to herein as MEMS sensor 600 and MEMS sensor 650, respectively. As shown, MEMS sensors 600 and 650 include sensor region 105-1, non-sensor region 105-2, MEMS structure 110, stress decoupling structure 115, and gel 120d. FIGS. 6A and 6B illustrate detailed views of MEMS sensor 600 and MEMS sensor 650, respectively, near MEMS structure 110. As such, sensor region 105-1 (comprising sensor region 105-1a and sensor region 105-1b in MEMS sensor 650), non-sensor region 105-2 (comprising non-sensor region 105-2a and non-sensor region 105-2b in MEMS sensors 600 and 650), and MEMS structure 110 are shown in greater detail as compared to the above-described implementations (although similar arrangements and structures may be present in the above-described implementations).

In MEMS sensor 600 and MEMS sensor 650, non-sensor region 105-2b may include a portion of non-sensor region 105-2 that is formed after non-sensor region 105-2a. Similarly, in MEMS sensor 650, sensor region 105-1b may include a portion of sensor region 105-1 that is formed after sensor region 105-1a. For example, sensor region 105-1b and non-sensor region 105-2b may include a set of layers formed as a result of one of more back-end of line (BEOL) processes, such as one or more metallization layers. Thus, in some implementations, such as MEMS sensor 600, stress decoupling structure 115 may be formed in the semiconductor device before BEOL processing is performed. In other implementations, such as MEMS sensor 650, stress decoupling structure 115 may be formed in the semiconductor device after or during BEOL processing.

In some implementations, as shown in both FIGS. 6A and 6B, non-sensor region 105-2b may be formed such that a portion of non-sensor region 105-2b overhangs trench openings of stress decoupling structure 115d. In some implementations, an overhang may have a thickness in a range from approximately 0.1 µm to approximately 10 µm, such as 3 µm. In some implementations, a cavity beneath such an overhang may have a height in a range from approximately 0.01 µm to approximately 5 µm, such as 50 nm. In some implementations, the overhang may be formed such that the overhang at least partially extends of a portion of the cavity separating sensor region 105-1/105-1a from non-sensor region 105-2a. In some implementations, an overhang and/or stress decoupling structure 115 can be formed using a carbon sacrificial layer process. For example, stress decoupling structure 115 and/or an overhang can be formed by forming a first portion of a back-end of line (BEOL) stack (e.g., after front-end of line and mid-end of line processing), creating openings in the first portion of the BEOL stack at defined areas, depositing a carbon sacrificial layer in the openings, forming a second portion of the BEOL stack, opening the BEOL stack to expose the carbon sacrificial layer, and removing the carbon sacrificial layer (e.g., before applying gel 120d).

In some implementations, the overhang acts to provide stress decoupling, while also preventing gel 120d from entering the trenches of stress decoupling structure 115. For example, an overhang may act to decouple non-sensor region 105-2b from sensor region 105-1/105-1a by forming a cavity (e.g., between non-sensor region 105-2b and sensor region 105-1/105-1a). Here, a height of the overhang cavity may be designed such that an opening is formed between MEMS structure 110 and non-sensor region 105-2 (e.g., as shown in FIG. 6A), such an opening is formed in non-sensor region 105-2b (e.g., as shown in FIG. 6B), where the opening is sized to prevent gel 120d from plugging the trenches of stress decoupling structure 115 (e.g., when a viscosity of gel 120d prevents gel 120d from entering the overhang cavity through the opening, as indicated in FIGS. 6A and 6B). As such, gel 120d acts to at least partially seal openings of stress decoupling structure 115 in MEMS sensor 600 and MEMS sensor 650.

Further, as shown, gel 120d may cover MEMS structure 110 (e.g., in order to protect MEMS structure 110 from mechanical shock, particle contamination, chemical substances, and/or the like). In some implementations, gel 120d may comprise a material that allows a target signal to reach MEMS structure 110 through gel 120d. For example, gel 120d may comprise a material with a relatively low Youngs modulus, as described above. In some implementations, a thickness of gel 120d over MEMS structure 110 may be in a range from approximately 1 µm to approximately 20 µm, such as 5 µm. In some implementations, elastic properties of gel 120d provide stress decoupling for the physical connection between sensor region 105-1 and non-sensor region 105-2 that is provided by gel 120d. In other words, gel 120d may intrinsically include a stress decoupling structure as a result of elastic properties of a material from which gel 120d is formed.

As indicated above, FIGS. 6A and 6B are provided merely as examples. Other examples are possible and may differ from what was described with regard to FIGS. 6A and 6B. Further, the number, arrangement, and size of elements and layers shown in FIGS. 6A and 6B are provided as examples. In practice, MEMS sensors 600 and/or 650 may include additional elements and/or layers, fewer elements and/or layers, different elements and/or layers, differently arranged elements and/or layers, differently sized elements and/or layers, elements and/or layers with different relative sizes, and/or the like, than those shown in FIGS. 6A and 6B.

Figure 7A:
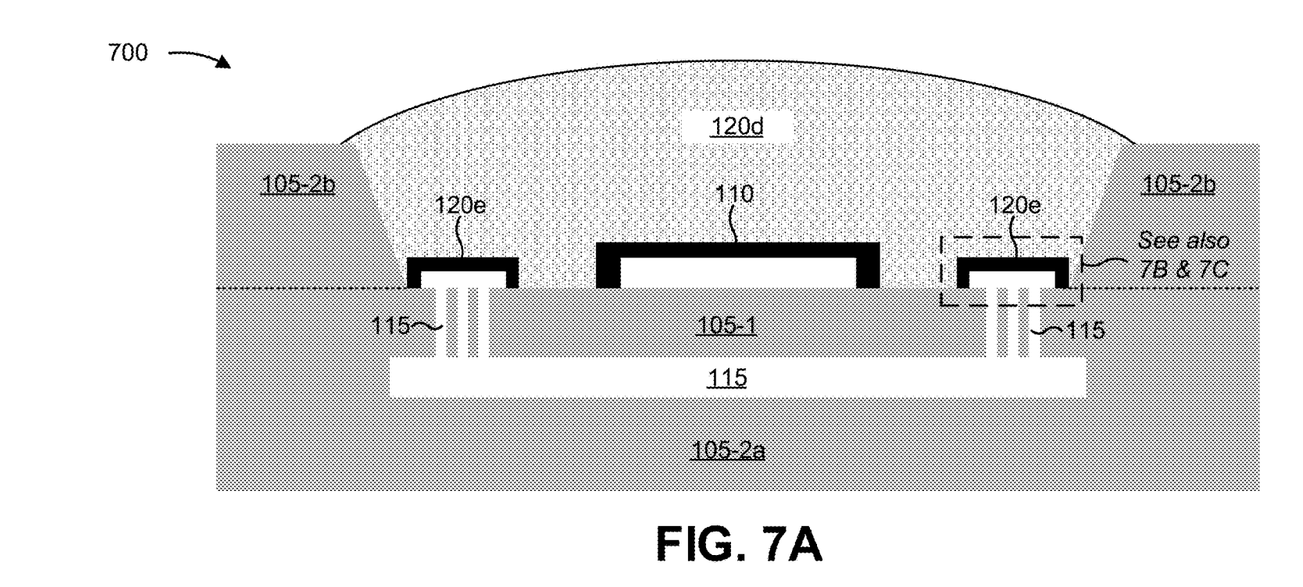
FIGS. 7A-7C are diagrams of an example implementation of an improved stress decoupled MEMS sensor in which a sealing element comprises a gel and a gel protection cap.
Figure 7B:
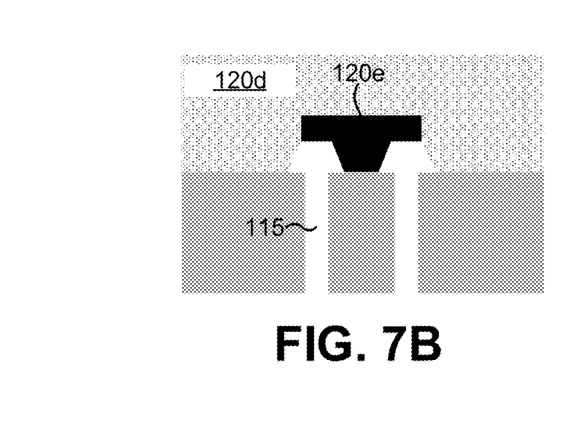
Figure 7C:
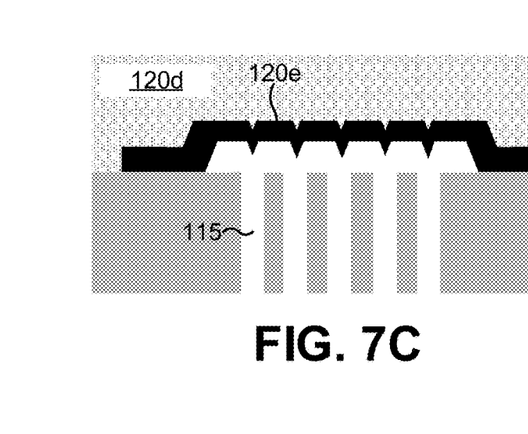

FIGS. 7A-7C are diagrams of an example implementation of MEMS sensor 100 in which sealing element 120 comprises gel 120d and a gel protection cap 120e. The improved stress decoupled MEMS sensor of FIGS. 7A-7C is herein as MEMS sensor 700. As shown, MEMS sensor 700 includes sensor region 105-1, non-sensor region 105-2, MEMS structure 110, stress decoupling structure 115, gel 120d, and gel protection cap 120e. FIG. 7A illustrates detailed views of MEMS sensor 700 near MEMS structure 110. As such, sensor region 105-1, non-sensor region 105-2 (comprising non-sensor region 105-2a and non-sensor region 105-2b), and MEMS structure 110 are shown in greater detail as compared to some of the above-described implementations (although similar arrangements and structures may be present in those above-described implementations).

As shown in FIG. 7A, gel protection cap 120e may be formed in order to at least partially seal openings of stress decoupling structure 115 (e.g., by preventing gel 120d from entering openings of stress decoupling structure 115). In some implementations, gel protection cap 120e may comprise, for example, a polysilicon material. In some implementations, gel protection cap 120e may be formed from a same material as MEMS structure 110. In some implementations, gel protection cap 120e may be formed during a same processing step as MEMS structure 110 (e.g., using a poly lamella process).

In some implementations, gel protection cap 120e can be formed to have a closed sidewall, as shown in FIGS. 7A and 7C. In some implementations, gel protection cap 120e can be formed to have an open sidewall, as shown in FIG. 7B. In the case of an open sidewall, a height of gap between gel protection cap 120e and sensor region 105-1 can be formed such that a gel 120d does not enter the trench openings of stress decoupling structure 115. For example, a portion of gel protection cap 120e may act as an overhang with an opening that is sized to prevent gel 120d from plugging the trenches of stress decoupling structure 115 (e.g., when a viscosity of gel 120d prevents gel 120d from entering the cavity).

As indicated above, FIGS. 7A-7C are provided merely as examples. Other examples are possible and may differ from what was described with regard to FIGS. 7A-7C. Further, the number, arrangement, and size of elements and layers shown in FIGS. 7A-7C are provided as examples. In practice, MEMS sensor 700 may include additional elements and/or layers, fewer elements and/or layers, different elements and/or layers, differently arranged elements and/or layers, differently sized elements and/or layers, elements and/or layers with different relative sizes, and/or the like, than those shown in FIGS. 7A-7C.

Figure 8:
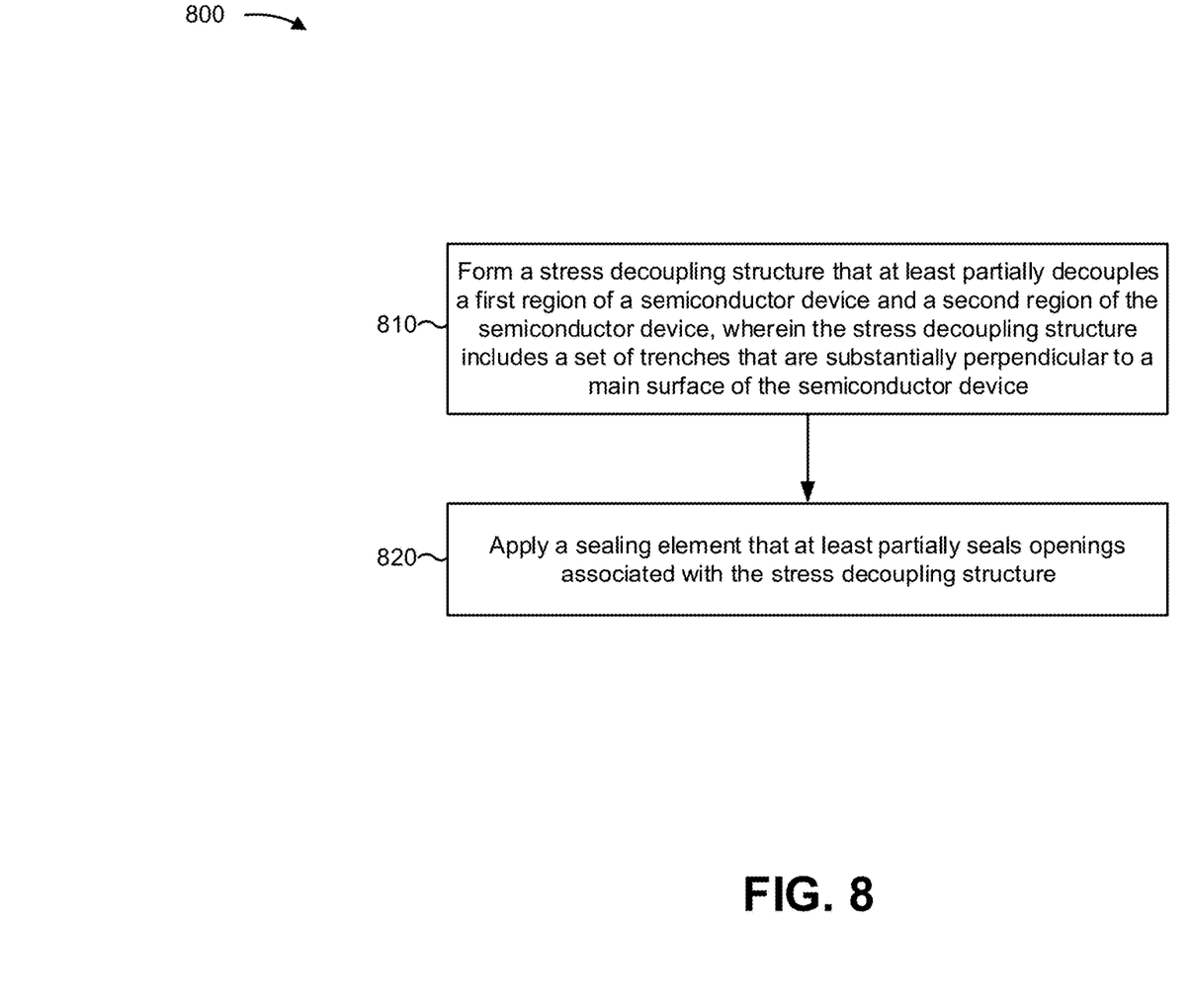
FIG. 8 is a flow chart of an example process for fabricating improved stress decoupled MEMS sensors described herein.

FIG. 8 is a flow chart of an example process 800 for fabricating improved stress decoupled MEMS sensors described herein.

As shown in FIG. 8, process 800 may include forming a stress decoupling structure that at least partially decouples a first region of a semiconductor device and a second region of the semiconductor device, wherein the stress decoupling structure includes a set of trenches that are substantially perpendicular to a main surface of the semiconductor device (block 810). For example, stress decoupling structure 115 may be formed, where stress decoupling structure 115 at least partially decouples sensor region 105-1 and non-sensor region 105-2, and includes a set of trenches that are substantially perpendicular to a main surface of the semiconductor device, as described above. In some implementations, stress decoupling structure 115 may be formed by etching trenches in the semiconductor device (e.g., using deep trench processing) and/or by forming openings and/or cavities in the semiconductor device (e.g., using carbon sacrificial layer processing, using a SON process, and/or the like), as described above.

As further shown in FIG. 8, process 800 may include applying a sealing element that at least partially seals openings associated with the stress decoupling structure (block 820). For example, sealing element 120 may be formed, where sealing element 120 at least partially seals openings associated with stress decoupling structure 115, as described above. In some implementations, sealing element 120 may be applied by attaching sealing element 120, depositing sealing element 120, placing sealing element 120, and/or the like, as described in the above examples. In some implementations, sealing element 120 may include a cap 120a (e.g., a cap comprising a dense material), a cap 120b (e.g., a cap comprising an elastic material), a die attach material 120c, a gel 120d, and/or a gel protection cap 120e, as described above.

In some implementations, such as MEMS sensor 200, stress decoupling structure 115 and/or sealing element 120 can be formed during package-level processing. In some implementations, such as MEMS sensors 600, 650, and 700, stress decoupling structure 115 and/or sealing element 120 can be formed during wafer-level processing, which may reduce cost and/or fabrication complexity (e.g., as compared to package-level processing).

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Implementations described herein provide improved stress decoupled MEMS sensors that include stress decoupling structure 115 that at least partially decouples a sensor region 105-1 and a non-sensor region 105-2, and sealing element 120 that at least partially seals openings of stress decoupling structure 115 (e.g., in order to prevent stress decoupling structure 115 from being penetrated).

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A semiconductor device, comprising:
   a stress decoupling structure to at least partially decouple a first region of the semiconductor device and a second region of the semiconductor device,
      wherein the stress decoupling structure includes a set of trenches that are substantially perpendicular to a main surface of the semiconductor device, and
      wherein the first region includes a micro-electro-mechanical (MEMS) structure; and
   a sealing element to at least partially seal openings of the set of trenches of the stress decoupling structure,
      wherein the sealing element includes a cap that includes another stress decoupling structure to decouple the first region and the second region.

2. The semiconductor device of claim 1, wherein the stress decoupling structure further includes a cavity that at least partially separates the first region from the second region.

3. The semiconductor device of claim 1, wherein the cap is formed from silicon or glass.

4. The semiconductor device of claim 1, wherein the cap is affixed to the first region and the second region using a wafer bonding process.

5. The semiconductor device of claim 1, wherein the cap is formed from an elastic material.

6. The semiconductor device of claim 5, wherein the elastic material at least partially fills the set of trenches of the stress decoupling structure.

7. The semiconductor device of claim 1, further comprising a molded package including an opening over the MEMS structure.

8. The semiconductor device of claim 1, further comprising a gel that covers the MEMS structure.

9. A micro-electro-mechanical system (MEMS) sensor, comprising:
   a first region comprising a MEMS structure;
   a second region;
   a stress decoupling structure that at least partially decouples the first region and the second region,
      wherein the stress decoupling structure includes a set of trenches; and
   a sealing element to at least partially seal openings of the set of trenches to prevent penetration of the set of trenches,
      wherein the sealing element includes a gel.

10. The MEMS sensor of claim 9, wherein the stress decoupling structure further includes a cavity that at least partially separates the first region from the second region.

11. The MEMS sensor of claim 9, wherein the sealing element further includes a gel protection cap.

12. The MEMS sensor of claim 11, wherein the gel protection cap has an open sidewall.

13. The MEMS sensor of claim 11, wherein the gel protection cap comprises a same material as the MEMS structure.

14. The MEMS sensor of claim 9, wherein the gel covers the MEMS structure.

15. The MEMS sensor of claim 9, wherein a portion of the second region overhangs the set of trenches such that the gel is prevented from entering the set of trenches by the portion of the second region, and
   wherein the portion of the second region is a portion of a back-end of line (BEOL) stack of the MEMS sensor.

16. A method, comprising:
   forming a stress decoupling structure that at least partially decouples a first region of a semiconductor device and a second region of the semiconductor device,
      wherein the stress decoupling structure includes a set of trenches that are substantially perpendicular to a main surface of the semiconductor device; and
   applying a sealing element that at least partially seals openings of the set of trenches,
      wherein the sealing element includes a die attach material.

17. The method of claim 16, wherein forming the stress decoupling structure comprises:
   forming the stress decoupling structure on a surface of the semiconductor device that is opposite to the main surface of the semiconductor device.

18. The method of claim 17, wherein the first region comprises a micro-electro-mechanical system (MEMS) structure on the main surface of the semiconductor device.

19. The method of claim 16, wherein the first region comprises a micro-electro-mechanical system (MEMS) structure, and
   wherein the method further comprises:
      covering the MEMS structure using a gel.

20. The method of claim 16, wherein forming the stress decoupling structure that at least partially decouples the first region of the semiconductor device and the second region of the semiconductor device comprises:
   forming a cavity that at least partially separates the first region from the second region.

* * * * *